HIGH VOLTAGE CONVERTER APPARATUS HAVING A PLURALITY OF SERIALLY CONNECTED CONTROLLABLE SEMICONDUCTOR DEVICES

Filed Sept. 8, 1965 5 Sheets-Sheet 1

WITNESSES:
Bernard R. Giegue
James F. Young

INVENTORS
Lee A. Kilgore and
Harvey E. Spindle.
BY
Donald R. Lackey
ATTORNEY 3,386,027

HIGH VOLTAGE CONVERTER APPARATUS HAVING A PLURALITY OF SERIALLY CONNECTED CONTROLLABLE SEMICONDUCTOR DEVICES

Lee A. Kilgore, Franklin Township, Export, and Harvey E. Spindle, Wilkins Township, Pittsburgh, Pa., assignors to Westinghouse Electric Corporation, Pittsburgh, Pa., a corporation of Pennsylvania Filed Sept. 8, 1965, Ser. No. 485,743
15 Claims. (Cl. 321—11)

ABSTRACT OF THE DISCLOSURE

High voltage converter apparatus of the type having a plurality of serially connected, controllable semiconductor devices. The converter apparatus includes means for providing a substantially uniform voltage distribution across the devices, and for maintaining the uniform distribution while the devices are being switched. The converter apparatus also includes firing means for switching the devices, using electromagnetic radiation to trigger the firing means.

Figure 1:
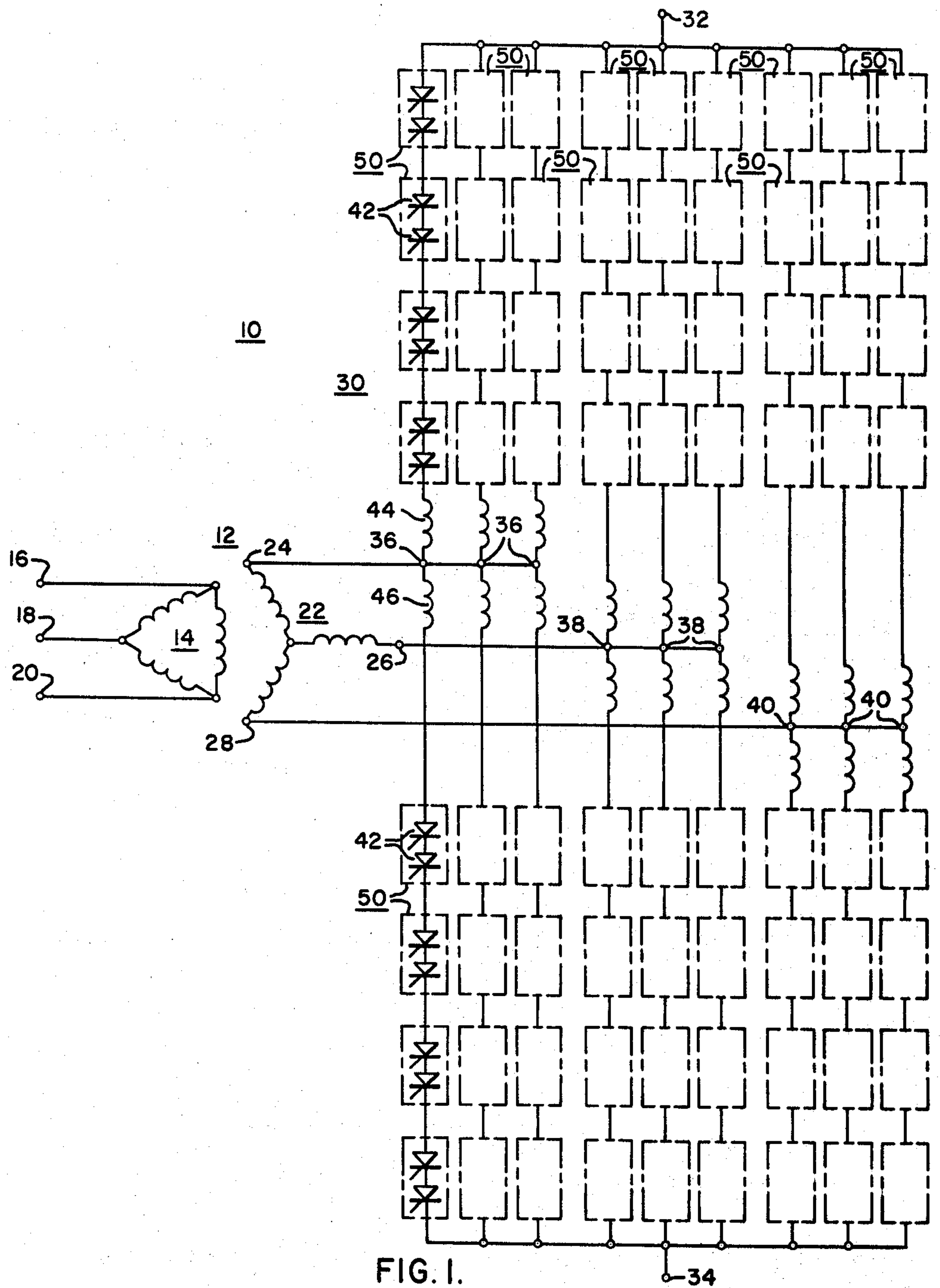

Converters which utilize controllable semiconductor devices, such as rectifiers and inverters, present many difficult problems when applied to high voltage applications. Controllable semiconductor devices, such as silicon controlled rectifiers, have a maximum peak reverse voltage rating (PRV) which is the maximum repetitive peak reverse blocking voltage that may be applied to the anode-cathode of the device with the gate open. Therefore, when applied to high voltage applications, a plurality of semiconductor devices are serially connected. The number of devices which must be serially connected, depends upon the peak reverse voltage rating of the device, and the maximum voltage which will be connected across the serially connected string of devices. For example, in D.C. transmission at 375 kv.± as many as 600 controllable semiconductor devices may be serially connected, even when two separate bridge circuits are used on each side of ground.

The peak reverse voltage of a controlled rectifier is derated a certain amount by the equipment designer, to provide a factor of safety, with the amount of derating being determined by the particular application. The designer does not wish to derate the device beyond this initial amount, however, as the cost of the apparatus will be increased accordingly.

In order to work a plurality of serially connected controllable semiconductor devices close to their voltage limits, without unnecesary derating, it is essential that the voltage distribution across the devices be uniform. Voltage distribution across the serially connected devices, however, presents a difficult problem which must be overcome if serious derating is to be prevented.

The reverse characteristics of the devices may vary widely, making it possible for one or more of the serially connected devices to be subjected to reverse voltages in excess of their voltage limits. In order to prevent this occurrence, a resistor may be placed in parallel with each device in the series string. Transparent voltage distribution is also unequal due to the different junction capacities of the semiconductor devices, and the stray capacities from each device to ground. For example, if the junction capacitance of the device is equal to the stray capacitance of the device to ground, a steep rising wave front voltage applied to a serially connected string of devices would be equally divided across the two capacitances of the first device of the string. Thus, the differential voltage across the first device would be greater than one-half of the applied voltage. In order to overcome this transient voltage distribution problem, each device may be shunted with a capacitance of high value compared with the stray capacitance, which makes the shunting impedance a low value and uniformly divides the transient voltages. If the steady state voltage distribution and transient voltage distribution problems are solved, by utilizing shunt resistors and shunt capacitors, then the problem arises of how to pulse the gates of the serially connected devices without distributing the substantially uniform voltage distribution. When only a few controlled rectifiers are connected in series, their gates may be connected to individual secondary windings of a single pulse transformer. Conventional pulse transformers, however, have a high capacitance to ground through the transformer windings and leads, which limits the number of devices which may be pulsed from one transformer. Even by connecting large capacitors across each device, such as .5 microfarad each, in an attempt to offset the transformer capacitance to ground, unequal transient voltage distribution would require serious derating if more than 30 devices are pulsed from one pulse transformer. Even if the serially connected devices are arranged in groups of 10 to 30 devices, with each group having their gates pulsed from a separate pulse transformer, the problem of how to pulse the groups without affecting the voltage distribution between the groups, remains. It would, thus, be desirable to provide a new and improved arrangement for pulsing a group of serially connected controllable semiconductor devices from one pulse transformer, which group is connected in series with additional groups of serially connected devices, without affecting the voltage distribution between groups. Further, it would be desirable to pulse the transformer of each group of devices by an arrangement which does not require any of the apparatus to be insulated for the full voltage applied across all of the serially connected groups of devices.

Another problem which arises when large pluralities of controlled semiconductor devices are connected in series, is in limiting the rate of rise of the anode current. Even though the devices can easily dissipate the heat caused by the average current, they will be damaged if the rate of rise of anode current exceeds a predetermined magnitude. This is due to the fact that when a controlled rectifier is pulsed, only a small area near the gate lead is turned on initially by the gate signal, and the turned on area then spreads over the remaining area of the junction. The small initial area turned on cannot dissipate much power without damage. Thus, it would be desirable to provide a new and improved arrangement for controlling the rate of rise of anode current until the total junction area has turned on, preventing excessive rates of rise of anode current due to large capacitors connected across the individual devices which discharge through the device when it starts to conduct, and also due to transient voltage buildup on the devices which switch slower than other devices in the series string. The means for limiting the rate of rise of anode current should not adversely affect the operation of the circuit, either from the standpoint of operating performance, or efficiency.

Accordingly, it is an object of the invention to provide a new and improved high voltage converter which utilizes controllable semiconductor devices.

Another object of the invention is to provide a new and improved converter arrangement having a plurality of serially connected, controllable semiconductor devices, which provides a substantially uniform voltage distribution across the devices.

A further object of the invention is to provide a new and improved converter arrangement having a plurality of serially connected groups, each comprising a plurality of serially connected, controllable semiconductor devices, which allows the control electrodes of the controllable semiconductor devices in each group to be pulsed without affecting the voltage distribution between groups.

Still another object of the invention is to provide a new and improved high voltage converter arrangement which utilizes a plurality of serially connected controlled rectifiers, and which limits the rate of rise of anode current of each controlled rectifier.

Another object of the invention is to provide a new and improved arrangement for pulsing the gates of serially connected controllable semiconductor devices, which only requires the pulsing components to be electrically insulated for the voltage across a predetermined number of devices.

A further object of the invention is to provide a new and improved reliable, high voltage converter, having a plurality of serially connected controllable semiconductor devices, which allows the devices to be worked close to the sum of the voltage limits of the devices.

Briefly, the present invention accomplishes the above cited objects by providing a converter having a plurality of serially connected, controllable semiconductor devices, such as silicon controlled rectifiers, with the serially connected devices being arranged into a plurality of serially connected groups. Each group has a single pulse transformer for providing switching or gating signals to the control electrode of each device in the group, with the number of devices in each group being determined by the characteristics of the pulsing transformers. The inherent capacitance to ground of conventional pulse transformers allows only 10 to 30 devices to be connected thereto, without requiring serious derating of the devices. The voltage across each group of devices is used to provide the energy for pulsing the primary winding of the pulse transformer in certain embodiments of the invention, with means responsive to electromagnetic energy being used to trigger the pulsing of the primary winding. By pulsing the pulse transformer of each group by electromagnetic energy, such as light or radio energy, electrical isolation is achieved, requiring the pulsing components of each group to be electrically insulated for only the voltage across each group, and not for the total voltage across all of the groups.

A capacitor and resistor arrangement associated with the pulsing components of each group, act to limit sudden changes in voltage resulting from pulsing the pulse transformer, and also aids in maintaining voltage distribution across the groups when the controlled rectifiers of the groups are nonconductive. Thus, the groups are pulsed by an arrangement which does not affect the voltage distribution across the groups.

In order to maintain a substantially uniform voltage distribution across each device or controlled rectifier in each group, a resistor is connected in shunt with each device to aid steady state distribution, and a capacitor is connected in shunt with each device to aid transient voltage distribution. However, instead of allowing the shunt capacitor to discharge uncontrolled through its associated semiconductor device when the gate of the device is pulsed, which may produce an anode current having an excessive rate of rise, and to limit the rate of rise of anode current in the devices in the group which turn on slower than other devices, parallel connected inductance and resistance means are connected in series with each semiconductor device, and a resistance means is connected in series with each shunt capacitor. This combination cooperates to control the rate of change of current in each semiconductor device, and also provides the damping necessary to prevent current reversal in the device, due to the oscillatory nature of the current discharging from the shunt capacity, and the external capacitance of the circuit, such as the capacitance of the windings and bushings of an associated power transformer.

Further objects and advantages of the invention will become apparent as the following description proceeds and features of novelty which characterize the invention will be pointed out in particularity in the claims annexed to and forming a part of this specification.

Figure 2:
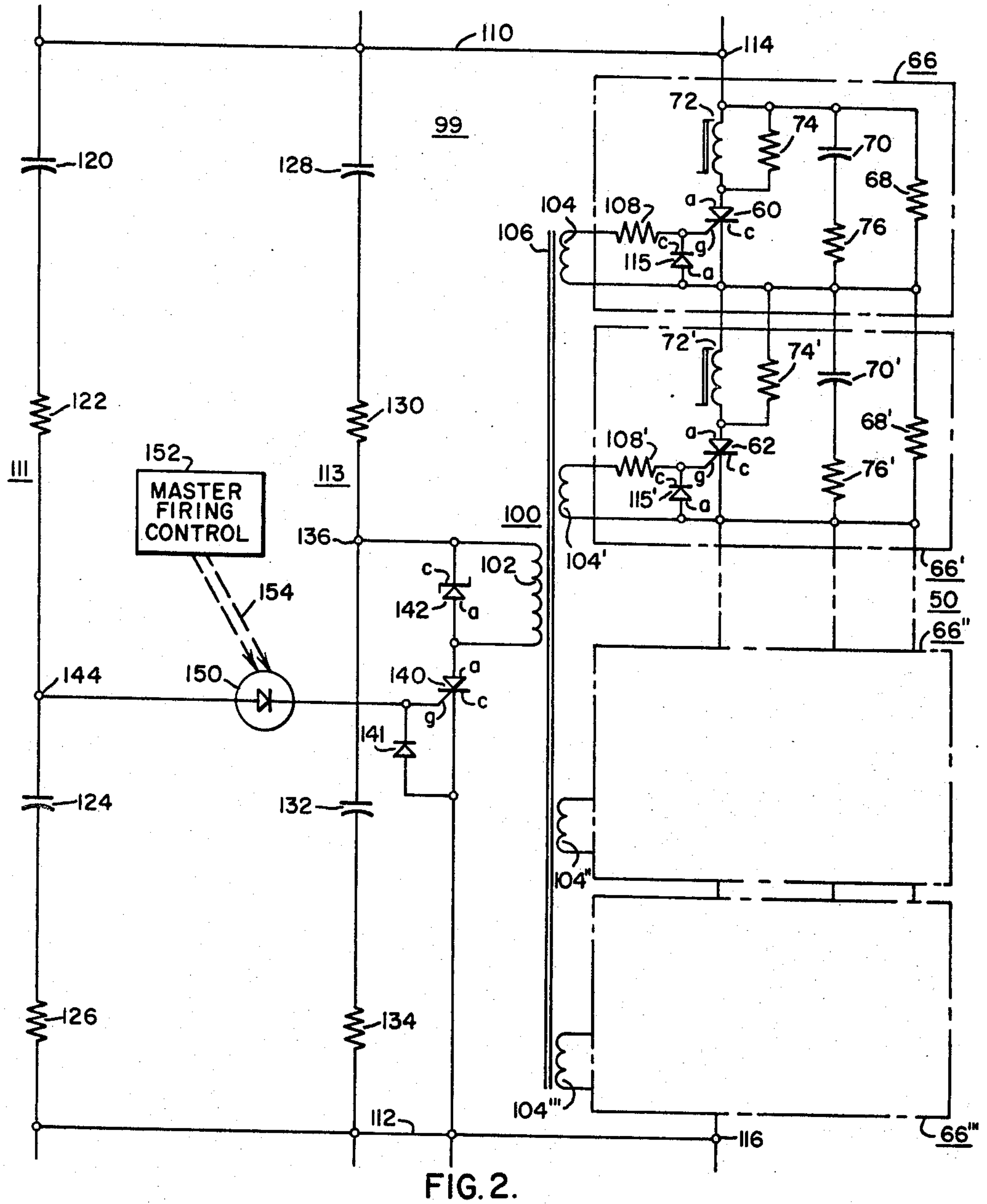
Figure 2A:
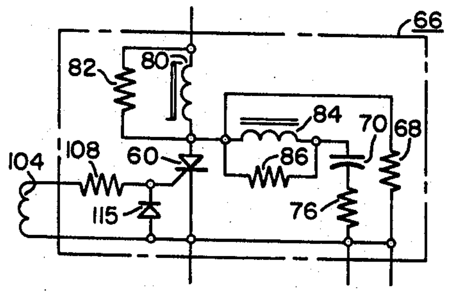
Figure 3:
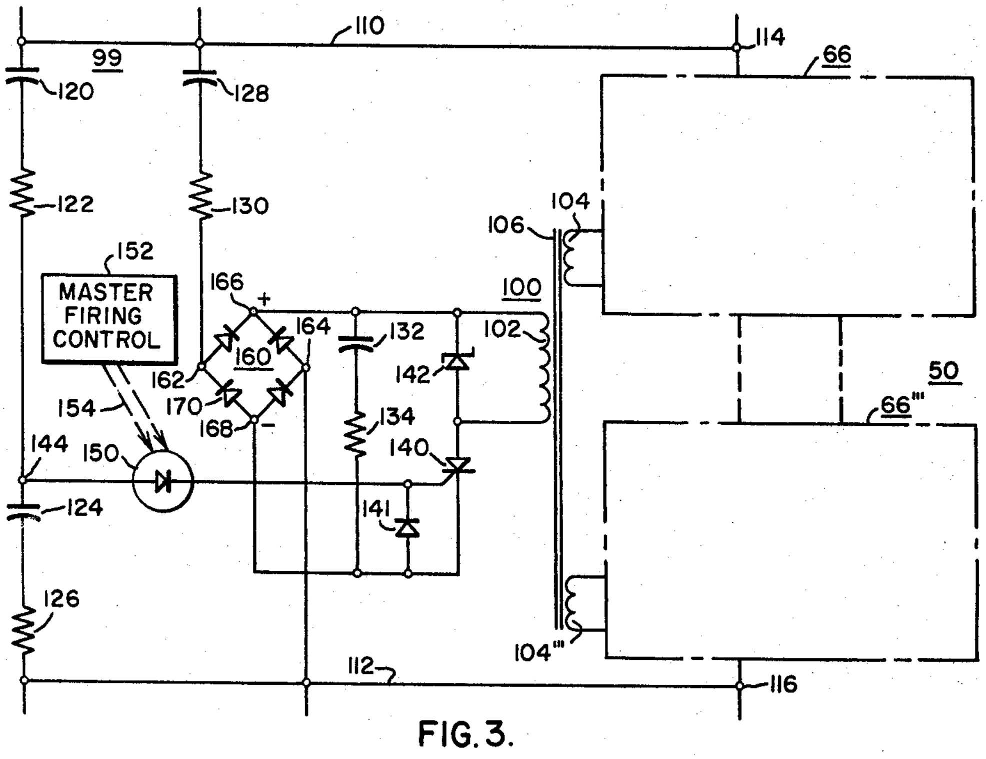
Figure 2B:
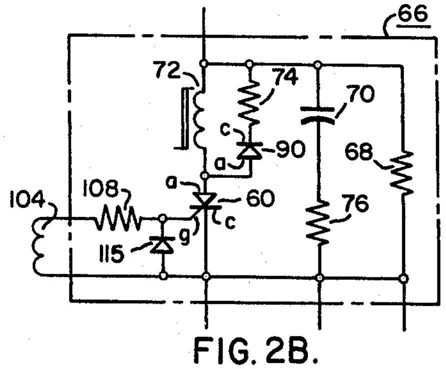
Figure 4:
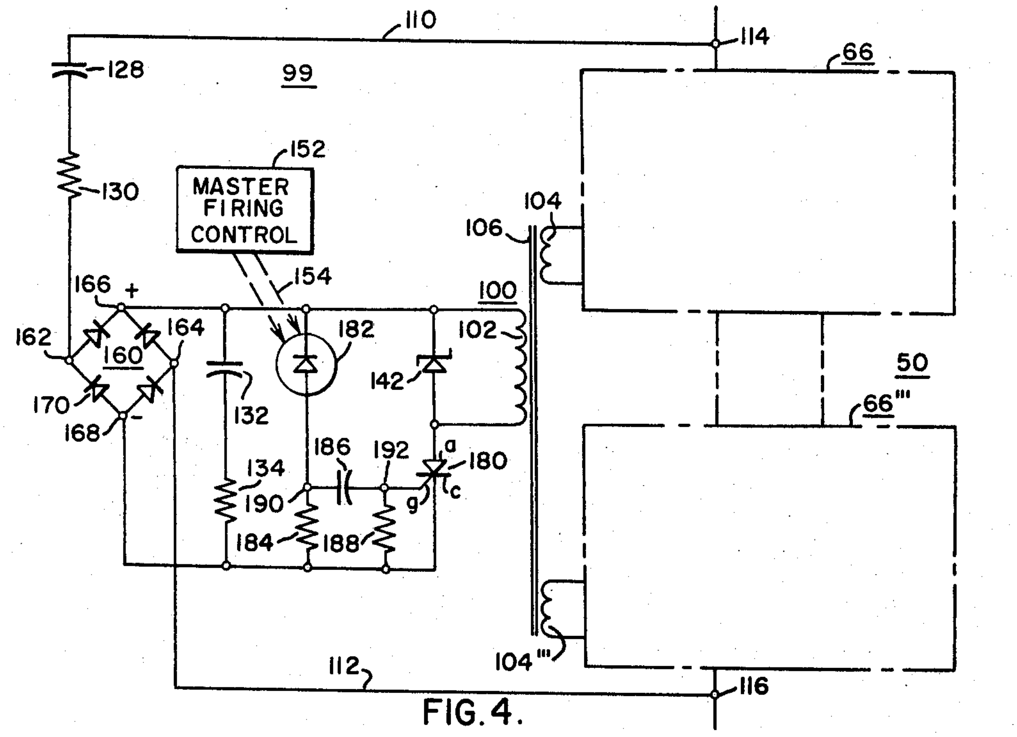
Figure 5:
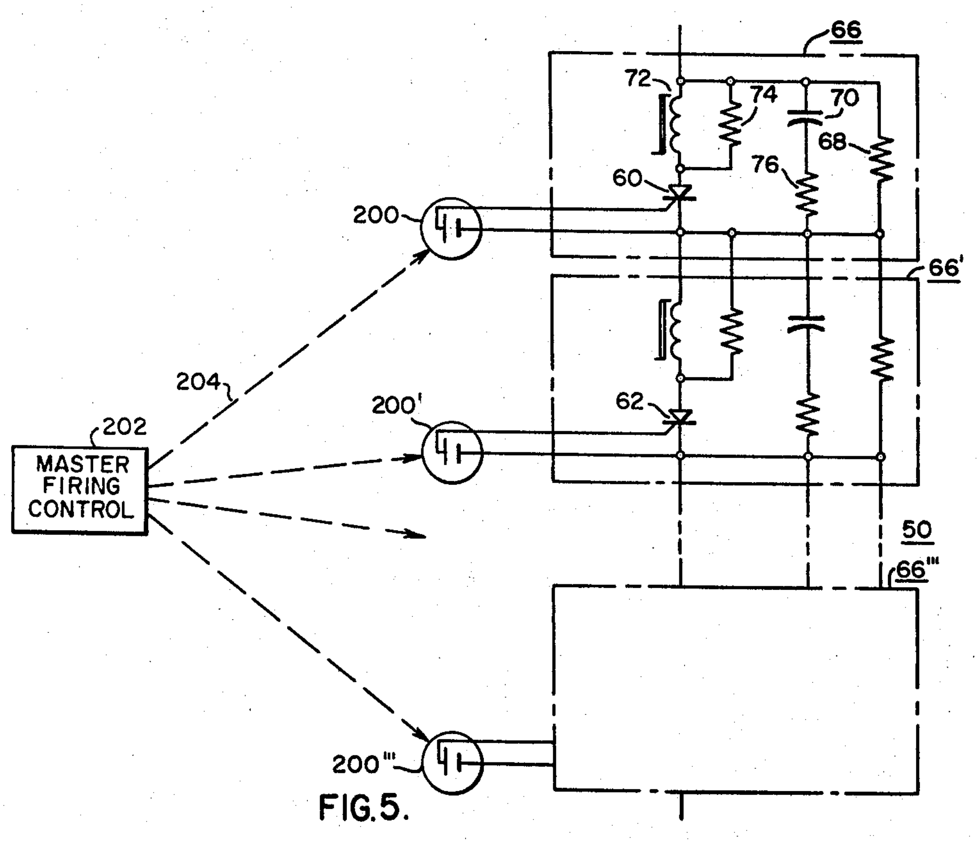
Figure 6:
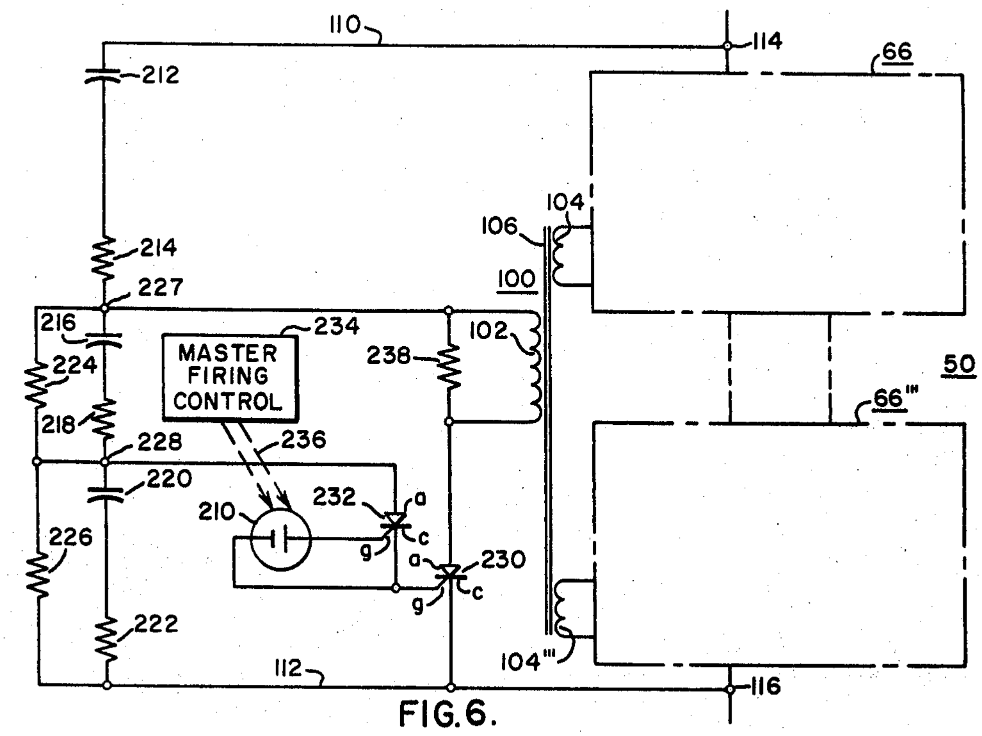
Figure 7:
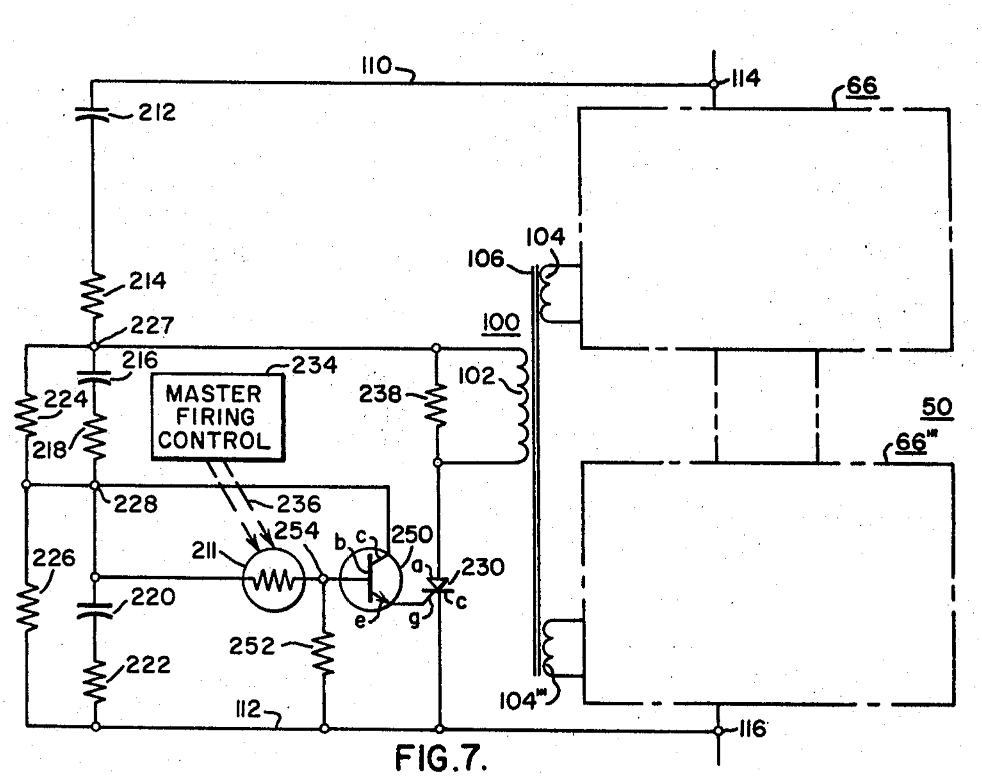

For a better understanding of the invention, reference may be had to the following detailed description, taken in connection with the accompanying drawings, in which:

FIGURE 1 is a schematic diagram illustrating a three-phase bridge circuit having a plurality of controllable semiconductor devices, which may utilize the teachings of the invention, FIG. 2 is a schematic diagram illustrating a group of serially connected, controllable semiconductor devices, having pulsing means and means for controlling rate of change of current, constructed according to an embodiment of the invention, FIG. 2A is a schematic diagram illustrating a modification of the circuit shown in FIG. 2, FIG. 2B is a schematic diagram illustrating another embodiment of the invention for limiting the rate of change of current in each of the plurality of serially connected, controllable semiconductor devices, FIG. 3 is a schematic diagram of another embodiment of the invention for pulsing the control elements of a group of serially connected controllable semiconductor devices, FIG. 4 is a schematic diagram of another embodiment of the invention for pulsing serially connected, controllable semiconductor devices, FIG. 5 is a schematic diagram of another embodiment of the invention for pulsing serially connected controllable semiconductor devices, FIG. 6 is a schematic diagram of still another embodiment of the invention for pulsing serially connected controllable semiconductor devices; and FIG. 7 is a schematic diagram of still another embodiment of the invention.

The teachings of this invention apply in general to any apparatus or arrangement which utilizes a large plurality of controllable semiconductor devices which are connected in series circuit relation. FIGURE 1 is a schematic diagram illustrating a high voltage converter 10, of the type which utilizes a large plurality of serially connected, controllable semiconductor devices. The converter 10 includes a three-phase power transformer 12, having a first winding 14 connected to terminals 16, 18 and 20, which are adapted for a connection to an alternating current circuit, and a second winding 22 connected to terminals 24, 26 and 28. The first and second windings 14 and 22 are shown having their phase windings connected in delta and wye, respectively, but any suitable arrangement may be used. Converter 10 also includes a three-phase bridge arrangement 30 connected to terminals 32 and 34, which terminals are adapted for connection to a direct current circuit. The phases or legs of bridge arrangement 30 have terminals 36, 38 and 40 connected to terminals 24, 26 and 28, respectively, of transformer winding 22.

Terminals 16, 18 and 20 may be connected to a source of alternating potential (not shown) and terminals 32 and 34 may be connected to a load circuit, in which case the average power flow will be from the alternating current to the direct current circuit. Or, terminals 32 and 34 may be connected to a source of direct current potential and terminals 16, 18 and 20 connected to a load circuit, in which case the average power flow will be from the direct current circuit to the alternating current circuit. Thus, the principles of the invention apply equally to converters for changing an alternating current potential to a direct current potential, or for changing a direct current potential to an alternating current potential.

High voltage converters, which utilize controllable semiconductor devices, require a large plurality of devices to be serially connected, with the number of devices being determined by the peak reverse voltage rating of the devices, and the potential to which the series string of devices will be subjected. Because of drawing space limitations, FIG. 1 only illustrates eight serially connected, controllable semiconductor devices, such as silicon controlled rectifiers 42, connected on each side of the phase terminals. However, it should be assumed that each pair of controllable rectifiers 42 indicates 10 to 30 serially connected controlled rectifiers designated generally as a group with the numeral 50. This group 50 of serially connected controlled rectifiers will be referred to throughout the specification, and it will be assumed that each group 50 will be serially connected with a plurality of other groups, and that the plurality of serially connected groups 50 may be connected in any desired arrangement with still other serially connected groups, such as the arrangement shown in FIG. 1.

In many instances, in order to obtain the desired current rating, serially connected groups 50 will be connected in parallel with other serially connected groups in each electrical phase, such as the three series strings of groups 50, shown in FIG. 1. A major problem associated with connecting series strings of group 50 in parallel, is current balancing, which may be obtained by current balancing means, such as reactors 44 and 46 connected between each phase terminal of bridge arrangement 30 and the serially connected controlled rectifiers 42, or balancing transformers, or any other suitable balancing means.

A far more difficult problem in experienced when trying to obtain a substantially uniform voltage division between serially connected controlled rectifiers 42. It is necessary to obtain a substantially uniform distribution of voltage across each serially connected string of controlled rectifiers 42, in order to prevent the voltage across any one device from exceeding its maximum safe value, and in order to work the string of serially connected devices close to the sum of their rated voltages. Uneven voltage distribution, either steady state or transient, results in derating the devices, necessitating more devices to be connected in the series string, and thus substantially increasing the cost of the apparatus.

When connecting a large plurality of uncontrolled semiconductor devices in series, such as silicon diodes, a substantially uniform steady state voltage distribution may be obtained by connecting a resistor in shunt with each of the devices. A substantially uniform transient voltage distribution may be obtained by connecting a capacitor in shunt with each device, whose capacitance is large compared with the capacitance of the device to ground. Thus, the transient impedance along the string is low compared with the transient impedance to ground.

When a controlled semiconductor device is substituted for an uncontrolled device, however, the voltage distribution problems are not solved by merely connecting a resistor and capacitance in shunt with each device. It is now necessary to pulse the control element of the device, without affecting the voltage distribution between the devices. Conventional pulsing transformers are capable of pulsing only about 30 devices without resorting to serious derating, because of the large amount of capacitance in the windings and leads of the pulse transformer. When more than approximately 30 devices are connected to the secondary windings of one pulse transformer, shunt capacitors of practical size are unable to prevent uneven voltage distribution. Further, the conventional pulse transformer, even if able to handle all of the devices, would be extremely costly, and it would have to be insulated for the voltage across the complete series string of the devices. Therefore, if conventional pulse type construction is to be utilized, each group 50 of controlled rectifiers 42 must be pulsed from a separate pulse transformer. The difficulties then presented are in switching each group 50 without disturbing the voltage distribution between groups, the electrical isolation of the pulsing apparatus of one group from the other groups and still obtain simultaneous pulsing of each serially connected group, and in controlling the rate of change of current in the serially connected devices when they are pulsed, to prevent the rate of rise of anode current from exceeding the value which would destroy the devices.

FIG. 2 is a schematic diagram of an embodiment of the invention which solves the hereinbefore mentioned difficulties. FIG. 2 represents a group 50 of controllable semiconductor devices, wherein a plurality of semiconductor devices are serially connected and pulsed from one transformer. More specifically, FIG. 2 shows a group 50 having a plurality of controllable semiconductor devices, such as semiconductor controlled rectifiers 60 and 62, each having an anode electrode *a* a cathode electrode *c*, and a gate or control electrode *g*. Each controlled rectifier, in each serially connected group 50 will have the same components within the imaginary enclosures 66, 66′, 66″ and 66‴. Therefore, only controlled recifier 60 and its associated components and arrangements will be described in detail.

In order to aid in uniformly distributing reverse voltage across group 50, a resistor is connected in shunt with each of the serially connected controlled rectifiers, such as resistor 68. These shunt resistors reduce the effects of the different reverse characteristics of the plurality of controlled rectifiers. Further, in order to distribute transient voltages substantially uniformly throughout the group 50, a capacitor, such as capacitor 70, is connected in shunt with each of the controlled rectifiers, which makes the series impedance of the serially connected string of controlled rectifiers low, compared to their impedance to ground through stray capacitance.

In order to control or limit the rate of change of the anode current in each of the controlled rectifiers, to prevent the junction from being destroyed before the "turned-on" area has spread throughout the entire junction, a reactor or inductor 72 and resistor 74 are connected in parallel, and this parallel combination is connected in series circuit relation with the main electrodes of each of the controlled rectifiers. The anode current, without means for limiting its rate of rise, may have too steep a rate due to many factors. For example, the differences in switching speeds of different controlled rectifiers, produce higher voltages across the slower devices, and thus increase the rate of change of anode current when the slower devices finally conduct. Further, the relatively large capacitor 70, required to offset the device capacity to ground and the pulse transformer capacity to ground, discharges through the device when it starts to conduct. To limit this discharge current, a resistor 76 is connected in series circuit relation with shunt capacitor 70. The parallel inductance-resistance combination connected in series circuit relation with each of the controlled rectifiers, controls the rate of rise of the anode current, and keeps it from exceeding a safe magnitude. The resistor 76 in series with the shunt capacitor 70, and the resistor 74 in shunt with inductance 72, provide the damping necessary to avoid a reversal of current through the semiconductor devices, due to the oscillatory nature of the current discharging from the shunt capacitor 70 and stray capacitance to ground. Current reversal must be prevented, as it would cause the semiconductor device to block and not refire, if the gate pulse was already decaying.

Inductor 72 must be responsive to high frequencies, in order to limit the rate of rise of anode current, and may be of the saturating type, as shown in FIG. 2, or of the non-saturating type, as desired. Since it is only necessary to have the effect of the inductor 72 in the circuit during the time the devices are turning on, it would be desirable to thereafter have the inductors saturate, and therefore eliminate their inductive voltage drop in the circuit. However, if the loss produced by non-saturating inductors may be tolerated, they may be used.

If the controlled rectifiers are not consturcted individually, but are formed with a large plurality disposed in one stack, with only heat sinks disposed between the wafers of semiconductor material under backing plates, the necessary series inductance may be obtained by disposing a split ferrite core around each device to produce the inductance required. To obtain the effect of a damping resistor, a fine wire coil may be wound around the ferrite core, with a resistor connected across it.

FIG. 2A illustrates an arrangement for limiting the rate of rise of anode current, which does not require connecting an inductance in series with each semiconductor device. An inductor 80 is connected in series with the group 50, with a resistor 82 being connected across inductor 80. Then, an inductor 84 is connected between each shunt capacitor 70 and its connection to the string of serially connected controlled rectifiers, such as controlled rectifier 60. A resistor 86 is connected in shunt with inductor 84. Inductor 80 may be saturating if desired, since it is connected in series with the controlled rectifier group 50.

FIG. 2B illustrates a modification of the circuit 66 shown in FIG. 2. If one or more controlled rectifiers, such as controlled rectifier 60 fails to conduct when pulsed, an increased voltage will appear across these controlled rectifiers. When they finally break down and conduct, it is important to insure that they will do so without damage. Resistor 74, connected in shunt with inductor 72, may cause an unsafe current condition when its associated controlled rectifier finally does conduct. This condition may be prevented by isolating resistor 74 from the circuit in the direction which adversely affects the circuit operation, and allowing it to remain in the circuit in the other direction. In other words, the main function of resistor 74 is for damping purposes, to prevent current reversal, and this function is only performed when inductor 72 is generating voltage, not when it is discharging. Thus, an asymmetrically conducting device such as a rectifier or diode 90, may be connected in series circuit relation with resistor 74 across inductor 72, and poled to allow current to flow through resistor 74 only from the end of inductor 72 that is connected to controlled rectifier 60. Diode 90 also provides the function of diverting momentary reverse current from the inductor 72, and thus avoid an excessive voltage peak when the reverse current suddenly ceases. Thus, inductor 72 is effective on forward breakdown, but the voltage peak due to the momentary flow of reverse current from inductor 72 is prevented. The value of resistor 74 must be kept relatively low, so that it takes substantially all of the reverse current.

FIGS. 2, 2A and 2B illustrate new and improved arrangements for uniformly distributing transient and steady state voltages across each controlled rectifier in a group of serially connected controlled rectifiers, and also for controlling the rate of rise of the anode current of each controlled rectifier. The next step is to pulse the gate electrodes of the controlled rectifiers without adversely affecting the voltage distribution between serially connected groups of controlled rectifiers. FIG. 2 illustrates an embodiment of the invention for pulsing all of the groups simultaneously, without disturbing the voltage distribution between the groups, and without subjecting any component to the total voltage across all of the serially connected groups.

More specifically, FIG. 2 illustrates a gating arrangement 99 for pulsing the gate electrodes *g* of all of the controlled rectifiers in group 50, such as controlled rectifier 60. A pulse transformer 100 having a primary winding 102 and a plurality of secondary windings 104, all disposed in inductive relation with the magnetic core 105, is used to distribute gating pulses to the gate electrodes *g*. Pulse transformer 100 has a separate secondary winding 104 connected to each controlled rectifier, such as controlled rectifier 60, with one end of winding 104 being connected to the gate electrode *g* and the other end being connected to the cathode electrode *c* of its associated controlled rectifier. A current limiting resistor 108 is connected in series circuit relation with winding 104, and an asymmetrically conducting device, such as diode 115, is connected from the gate electrode *g* to the cathode electrode *c*, in shunt with winding 104, and poled to prevent reverse voltage from being applied to the gate electrode *g*.

The electrical energy for pulsing each group may be obtained by conductors 110 and 112 connected across the ends of group 50 at terminals 114 and 116, respectively. Voltage divider means, such as voltage divider networks 111 and 113 may be connected between conductors 110 and 112. Voltage divider network 111 may include capacitor 120, resistor 122, capacitor 124, and resistor 126, connected serially from conductor 110 to conductor 112. Voltage divider network 113 includes capacitor 128, resistor 130, capacitor 132, and resistor 134, connected serially from conductor 110 to conductor 112. Primary winding 102 of pulse transformer 100 is connected from voltage divider network 113 to conductor 112, with one of its ends being connected to junction 136 between the series circuit which includes capacitor 128 and resistor 130, and the series circuit which includes capacitor 132 and resistor 134. The remaining end of primary winding 102 is connected to conductor 112 through a controllable switching means, such as a silicon controlled rectifier 140, having an anode electrode *a*, cathode electrode *c*, and gate electrode *g*. Controlled rectifier 140 is poled to allow current to flow through primary winding 102 through conductor 110 to conductor 112, when it is switched to its conducting state. Since the group 50 may be switched at any predetermined angle of delay during the voltage cycle, from large to small delay angles, there will be a wide range of voltage applied to primary winding 102 of pulse transformer 100. The voltage applied to primary winding 102 may be limited by voltage regulating means, such as a Zener diode 142 having a cathode electrode *c*, and an anode electrode *a*, with the cathode electrode *c* being connected to the end of primary winding 102 that is connected to junction 136, and the anode electrode *a* being connected to the end of primary winding 102 that is connected to controlled rectifier 140. The turns ratio of the pulse transformer 100 is selected to provide adequate gate voltage with the minimum practical voltage which will be applied to the primary winding 102.

The voltage for gating controlled rectifier 140 is obtained from the voltage divider network 111, with the gate electrode *g* of controlled rectifier 140 being connected to the junction 144 between the series circuit which includes capacitor 120 and resistor 122, and the series circuit which includes resistor 124 and capacitor 126. An asymmetrically conductive device, such as diode 141, may be connected from the gate electrode *g* to the cathode electrode *c* of controlled rectifier 140, in order to protect the gate electrode.

A controllable switching means, such as electroradiative responsive means 150, is connected between junction 144 and gate electrode *g* of controlled rectifier 140. An electroradiative responsive means, such as a semiconductor device whose impedance is responsive to electromagnetic energy, such as light or radio energy, is selected. The electroradiative responsive means 150, which may be a photoresistive diode as shown, or a photoresistive transistor, provides the desired electrical isolation between the gating circuits of the various groups 50. This eliminates the necessity of providing any apparatus or components which would have to be electrically insulated for the total voltage across all of the serially connected groups. In operation, when voltage is applied to the serially connected groups, capacitors 120, 124, 128 and 132 will be charged, and the voltage at terminals 144 and 136 would be determined by the voltage divider networks 111 and 113. A master firing control circuit 152, which determines when the group 50 of each electrical phase should fire or conduct, emits a beam 154 of electromagnetic energy, such as light, which is focused on electroradiative device 150 when firing of the group is desired. Electroradiative device 150 switches from a blocking condition to an electrically conductive condition in response to the electromagnetic beam 154, which allows capacitor 124 to discharge into the gate electrode $g$ of controlled rectifier 140. The positive current pulse from capacitor 124 switches controlled rectifier 140 from its blocking to its conductive condition, which provides a discharge path for capacitor 132 through primary winding 102 of pulse transformer 100. The discharge current from capacitor 132, thus pulses the primary winding 102 of pulse transformer 100, producing simultaneous pulses in the secondary windings 104, which simultaneously gate or pulse all of the gate electrodes $g$ of the serially connected controlled rectifiers of the associated group 50. Master firing control circuits 152 are well known in the art and will not be described in detail.

Capacitors 120 and 128 limit the sudden change of voltage across group 50 which results when electroradiative device 150 and controlled rectifier 140 switch from their blocking to conductive conditions. Capacitor 132 and resistor 134 aid in maintaining uniform voltage distribution across the groups when the controlled rectifiers in the groups are turned off. The values of capacitors 128 and 132 are proportioned, such that the switching of controlled rectifier 140 or electroradiative device 150 to their conductive conditions, causes a step in voltage which is less than 10 percent. This may be accomplished by making the capacitance of capacitor 132 approximately 10 times the capacitance of capacitor 128.

Thus, FIG. 2 provides a new and improved arrangement for controlling the voltage distribution across serially connected groups of controllable semiconductor devices, and across each device within the group. Each group is gated by a pulse transformer which is electrically insulated for only the voltage across its associated group, with the gating of each group being simultaneously controlled by with electrical isolation between groups. If electroradiative devices are utilized, the electromagnetic energy from the master firing control may be produced by a xenon short arc lamp, which has a very fast response time, a light emitting semiconductor device, such as the laser diode, or by radio transmitter. If electroradiative devices responsive to radio waves are utilized, a UHF radio wave may be focused on the groups. A different UHF frequency could be used for each electrical phase, which would require less exact focusing, and still not cause false triggering. Further, the arrangement of FIG. 2 provides protection for the individual controlled rectifiers from excessive voltages, and controls the rate of rise of anode current to prevent destruction of the devices.

FIG. 3 is a schematic diagram illustrating a modification of the gating arrangement 99 shown in FIG. 2, with like reference numerals indicating like components. In the circuit shown in FIG. 2 the power for firing the group of serially connected controlled rectifiers was obtained by the capacitive voltage divider, which includes capacitors 128 and 132. This capacity divider may be made more efficient by utilizing a full-wave bridge rectifier 160, having input terminals 162 and 164, and output terminals 166 and 168, which includes a plurality of rectifiers or diodes 170. By connecting the input terminals 162 and 164 of rectifier 160 to conductors 110 and 112, and the series circuit including capacitor 132 and resistor 134 to the output terminals 166 and 168 of rectifier 160, capacitor 132 will be charged on either polarity of alternating current voltage, and capacitor 132 will be prevented from discharging back into the circuit. The circuit including primary winding 102 and controlled rectifier 140 are also connected across output terminals 166 and 168 of bridge rectifier 160. Thus, bridge rectifier 160 insures that sufficient stored energy will always be available to adequately pulse the primary winding 102 of transformer 100.

FIG. 4 is a schematic diagram which includes the rectifier arrangement 160 of FIG. 3, and also presents a further modification of the gating arrangement 99 of FIG. 2. In general, the arrangement of FIG. 4 utilizes a semiconductor gate controlled switch 180, having a cathode electrode $c$, anode electrode $a$, and a gate electrode $g$, instead of a silicon controlled rectifier 140, and utilizes the gate turn-off characteristic of the gate controlled switch to limit the amount of charge drained from capacitor 132 for each gate pulse applied to the primary winding 102 of pulse transformer 100. In this arrangement, the capactive voltage divider for the electroradiative transducer or means 150 of FIG. 2 is eliminated, and an electroradiative device 182 and resistor 184 are serially connected across the output terminals 166 and 168 of bridge rectifier 160. A capacitor 186 and resistor 188 are serially connected from the junction 190 between electroradiative device 182 and resistor 184, to terminal 168 of bridge rectifier 160. Gate controlled switch 180 has its anode electrode $a$ connected to primary winding 102, its cathode electrode $c$ connected to terminal 168 of bridge rectifier 160, and its gate electrode $g$ connected to the junction 192 between capacitor 186 and resistor 188. Master firing control circuit 152 provides a square pulse of electromagnetic energy 154. At the start of the square pulse of the electromagnetic energy, electroradiative device 182 will be switched to its conductive state, and capacitor 186 will charge and make the gate electrode $g$ positive with respect to cathode electrode $c$ of gate controlled switch 180, switching its conductive state, and allowing capacitor 132 to begin to discharge through primary winding 102. At the termination of the square electromagnetic pulse, capacitor 186, which has been charged during the pulse, will discharge, making the gate electrode $g$ negative and causing the gate controlled switch 180 to switch to its blocking state. Thus, capacitor 132 will only be discharged during the period of the square electromagnetic pulse.

Instead of using a square electromagnetic pulse, the same effect may be created by connecting a one-shot multivibrator between capacitor 186 and resistor 188, which is triggered by an electroradiative device in response to an electromagnetic beam of energy from master firing control 152. The time duration is thus set by the one-shot multivibrator.

FIG. 5 is a schematic diagram of a group 50 of serially connected, controllable semiconductor devices, in which each device is individually gated by an electroradiative device 200. Electroradiative device 200 is of the type which generates a potential when subjected to electromagnetic energy. Electroradiative device 200 is connected directly in the gating circuit of its associated controlled rectifier, from the gate electrode $g$ to the cathode electrode $c$. Each electroradiative device is triggered into generating a potential by master firing control 202, which emits beams 204 of electromagnetic energy which are focused on the individual electroradiative devices 200.

FIG. 6 is a schematic diagram illustrating how a single electroradiative device 210 may be used, in connection with pulse transformer 100, to supply gating pulses for a group 50 of controllable semiconductor devices. A capacity voltage divider network which includes serially connected capacitor 212, resistor 214, capacitor 216, resistor 218, capacitor 220, and resistor 222, is connected between terminals 114 and 116 of group 50. A resistor 224 is connected across the series circuit comprising capacitor 216 and resistor 218, and a resistor 226 is connected across the series circuit comprising capacitor 220 and resistor 222. One side of primary winding 102 is connected to the junction 227 between resistor 214 and capacitor 216, and the other side of primary winding 102 is connected to terminal 116 through a controllable switching means, such as controlled rectifier 230 having an anode electrode $a$, cathode electrode $c$, and gate electrode $g$. A resistor 238 may be connected across the primary winding 102.

A controllable switching means, such as controlled rectifier 232, having an anode electrode $a$, cathode electrode $c$, and gate electrode $g$, is connected to provide a gate signal to controlled rectifier 230. The anode electrode $a$ of controlled rectifier 232 is connected to the junction 228 between resistor 218 and capacitor 220, and its cathode electrode *c* is connected to the gate electrode *g* of controlled rectifier 230. An electroradiative device 210, such as a photovoltaic device, is connected from the gate electrode *g* to the cathode electrode *c* of controlled rectifier 232, and it produces a gating voltage for controlled rectifier 232 in response to a beam of electromagnetic energy from master firing control 234. When electroradiative device 210 produces a voltage in response to a beam 236 of electromagnetic energy, controlled rectifier 232 is switched from its blocking to its conductive condition, discharging capacitor 220 into the gate electrode *g* of controlled rectifier 230, causing controlled rectifier 230 to switch from its blocking to its conductive condition. When controlled rectifier 230 becomes conductive, capacitor 216 discharges through primary winding 102, providing the gating pulse for pulse transformer 100.

FIG. 7 illustrates a modification of the circuit shown in FIG. 6, wherein a transistor 250 having a base electrode *b*, emitter electrode *e*, and collector electrode *c* is used instead of a controlled rectifier to amplify the output of electroradiative device 210. Transistor 250 has its collector electrode *c* connected to junction 228 and its emitter electrode *e* connected to the gate electrode *g* of controlled rectifier 230. Photoresistive device 211 and resistor 252 are serially connected between junction 228 and terminal 116, with the base electrode *b* of transistor 250 being connected to junction 254 between photoresistive device 211 and biasing resistor 252. Thus, when beam 236 of electromagnetic energy from master firing control 234 energizes photoresistive device 211, transistor 250 is switched from its cut-off condition to saturation, allowing capacitor 220 to discharge through the collector-emitter circuit of transistor 250 and apply a gate signal to the gate electrode *g* of controlled rectifier 230. Controlled rectifier 230 is thus switched to its conductive state, allowing capacitor 216 to discharge and pulse the primary winding 102. Photoresistive device 211 may be symmetrical, as shown, or asymmetrical, such as a photodiode having its anode connected to the base electrode *b* and its cathode connected to the collector electrode *c*.

In summary, there has been disclosed a new and improved high voltage converter arrangement, which may be utilized with high voltage DC transmission systems, adjustable frequency inverter systems, or any other application which requires a large plurality of controllable semiconductor devices to be serially connected. The disclosed arrangement provides a substantially uniform voltage across each of the serially connected devices, and maintains the uniform distribution while the devices are switched. The disclosed arrangement is self-protecting, controlling the rate of rise of current to the devices to safe limits, and preventing other unsafe voltage and current conditions that may occur due to switching transients.

Since numerous changes may be made in the above-described apparatus and different embodiments of the invention may be made without departing from the spirit thereof, it is intended that all matter contained in the foregoing description or shown in the accompanying drawings shall be interpreted as illustrative, and not in a limiting sense.

We claim as our invention:

1. An electrical converter comprising a plurality of controllable semiconductor devices each having main electrodes and a control electrode, the main electrodes of said controllable semiconductor devices being serially connected, first means connected in circuit relation with each of said serially connected controllable semiconductor devices for distributing transient and steady state voltages across said devices in a substantially uniform manner, second means for controlling the rate of change of current flow through said controllable semiconductor devices, third means connected in circuit relation with the control electrode of each of said plurality of semiconductor devices for providing control signals, fourth means for radiating electromagnetic energy at predetermined intervals, said third means being responsive to the electromagnetic energy radiated by said fourth means to simultaneously apply control signals to the control electrodes of said plurality of controllable semiconductor devices, each time said fourth means radiates electromagnetic energy.

2. A protective and voltage distribution circuit for a plurality of serially connected controllable semiconductor devices connected to a source of electrical potential, comprising a plurality of controllable semiconductor devices each having main electrodes and a control electrode, first means for controlling rate of change of current connected in series circuit relation with the main electrodes of each of said controllable semiconductor devices, the main electrodes of said controllable semiconductor devices, including said first means, being connected in series circuit relation with one another, second means connected across each of the series circuits which include the main electrodes of one of said controllable semiconductor devices and said first means for storing electrical energy and distributing transient voltages across said serially connected controllable semiconductor devices in a substantially uniform manner, third means for controlling the discharge of the stored energy of said second means, said third means being connected in series circuit relation with each of said second means, fourth means for damping current oscillations connected in shunt with each of said first means, and fifth means connected across each of the series circuits which include the main electrodes of one of said controllable semiconductor devices and said first means for distributing steady state voltages across said controllable semiconductor devices in a substantially uniform manner.

3. A protective and voltage distribution circuit for a plurality of serially connected controllable semiconductor devices connected to a source of electrical potential, comprising a plurality of controllable semiconductor devices each having main electrodes and a control electrode, first means for controlling rate of change of current connected in series circuit relation with the main electrodes of each of said controllable semiconductor devices, the main electrodes of said controllable semiconductor devices, including said first means, being connected in series circuit relation with one another, second means connected across each of the series circuits which include the main electrodes of one of said controllable semiconductor devices and said first means, for storing electrical energy and distributing transient voltages across said serially connected controllable semiconductor devices in a substantially uniform manner, third means for controlling the discharge of the stored energy of said second means, said third means being connected in series circuit relation of each of said second means, fourth means for damping current oscillations connected in shunt with each of said first means, fifth means connected across each of the series circuits which include the main electrodes of one of said controllable semiconductor devices and said first means, for distributing steady state voltages across said controllable semiconductor devices in a substantially uniform manner, sixth means connected in circuit relation with the control electrodes of each of said plurality of semiconductor devices for providing control signals, and seventh means for radiating electromagnetic energy at predetermined intervals, said sixth means being responsive to the electromagnetic energy radiated by said seventh means to simultaneously apply control signals to the control electrodes of said plurality of controllable semiconductor devices, each time said seventh means radiates electromagnetic energy.

4. A protective and voltage distribution circuit for a plurality of serially connected controllable semiconductor devices connected to a source of electrical potential, comprising a plurality of controllable semiconductor devices each having main electrodes and a control electrode, inductance means connected in series circuit relation with each of the main electrodes of each of said controllable semiconductor devices for controlling the rate of change of current flow through said controllable semiconductor devices, the main electrodes of said controllable semiconductor devices, including said inductance means, being connected in series circuit relation with one another, capacitance means connected across each of the series circuits which include the main electrodes of one of said controllable semiconductor devices and said inductance means, for distributing transient voltages across said serially connected controllable semiconductor devices in a substantially uniform manner, first impedance means connected in series circuit relation with each of said capacitance means, second impedance means connected across each of said inductance means, said first and second impedance means cooperating to dampen current oscillations, asymmetrically conducting means connected in series circuit relation with each of said second impedance means, said asymmetrically conducting means being poled to allow momentary reverse current from said inductance means to flow through said second impedance means, and third impedance means connected across each of the series circuits which include the main electrodes of one of said controllable semiconductor devices and said inductance means, for distributing steady state voltages across said controllable semiconductor devices in a substantially uniform manner.

5. A protective and voltage distribution circuit for a plurality of serially connected controllable semiconductor devices connected to a source of electrical potential, comprising a plurality of controllable semiconductor devices each having main electrodes and a control electrode, a plurality of reactors, one of said reactors being connected in series circuit relation with the main electrodes of each of said controllable semiconductor devices, the main electrodes of said controllable semiconductor devices, including said reactors, being connected in series circuit relation with one another, a plurality of first resistors, one of said first resistors being connected in shunt with each of said reactors, a plurality of capacitors, a plurality of second resistors, one of said capacitors and one of said second resistors being serially connected across each of the series circuits which include the main electrodes of one of said controllable semiconductor devices and its associated reactor, a plurality of third resistors, one of said third resistors being connected across each of the series circuits which include the main electrodes of one of said controllable semiconductor devices and its associated reactor.

6. A protective and voltage distribution circuit for a plurality of serially connected, controllable semiconductor devices connected to a source of electrical potential, comprising a plurality of controllable semiconductor devices each having main electrodes and a control electrode, a plurality of saturable reactors, one of said saturable reactors being connected in series circuit relation with the main electrodes of each of said controllable semiconductor devices, the main electrodes of said controllable semiconductor devices, including said saturable reactors, being connected in series circuit relation with one another, a plurality of first resistors, one of said first resistors being connected in shunt with each of said saturable reactors, a plurality of capacitors, a plurality of second resistors, one of said capacitors and one of said second resistors being serially connected across each of the series circuits which include the main electrodes of one of said controllable semiconductor devices and its associated saturable reactor, a plurality of third resistors, one of said third resistors being connected across each of the series circuits which include the main electrodes of one of said controllable semiconductor devices and its associated saturable reactor, said saturable reactors controlling the rate of rise of current in said controllable semiconductor devices when controllable semiconductor devices are switched to their conductive state, said saturable reactors saturating after said controllable semiconductor devices have been completely switched to their conductive state to remove the inductive effect of said saturable reactors, said first and second resistors cooperating to dampen the oscillatory nature of the discharge current from said capacitors, said capacitors and third resistors distributing transient and steady state voltages, respectively, across said plurality of controllable semiconductor devices.

7. A protective and voltage distribution circuit for a plurality of serially connected controllable semiconductor devices connected to a source of potential comprising a plurality of controllable semiconductor devices each having main electrodes and a control electrode, the main electrodes of said serially connected controllable semiconductor devices being connected in series circuit relation, first inductance means connected in series circuit relation with said controllable semiconductor devices, first impedance means connected across said first inductance means, said first inductance means and first impedance means controlling the rate of change of current flow through said serially connected plurality of controllable semiconductor devices, second inductance means, capacitance means, second impedance means, said second inductance means, capacitance means, and second impedance means being serially connected across the main electrodes of each of said plurality of controllable semiconductor devices, third impedance means connected across each of said second inductance means, fourth impedance means connected across the main electrodes of each of said controllable semiconductor devices, said second inductance means controlling the rate of change of current when said capacitor discharges through its associated controllable semiconductor device, said second and third impedance means damping current oscillations, said capacitance and fourth impedance means distributing transient and steady state voltages, respectively, across said plurality of controllable semiconductor devices.

8. An electrical converter comprising a plurality of controllable semiconductor devices each having main electrodes and a control electrode, the main electrodes of said controllable semiconductor devices being serially connected, said serially connected controllable semiconductor devices being arranged in groups each having first and second ends, each of said groups having a predetermined number of serially connected controllable semiconductor devices, each of said groups including a pulse transformer having a primary winding and a plurality of secondary windings, each of said secondary windings being connected in circuit relation with a control electrode of one of said controllable semiconductor devices, each of said groups having first and second voltage divider networks connected to the first and second ends of said groups, said first voltage divider network including first and second serially connected capacitance means separated by a first terminal, with said first capacitance means being connected to the first end of the group and said second capacitance means being connected to the second end of the group, said second voltage divider network including third and fourth serially connected capacitance means separated by a second terminal, with the third capacitance means being connected to the first end of the group and said fourth capacitance means being connected to the second end of the group, the primary winding of each of the pulse transformers being connected between the second terminal of said second voltage divider network and the second end of its associated group, controlled rectifier means having main electrodes and a control electrode, the main electrodes of said controlled rectifier means being connected in series circuit relation with the primary winding of said pulse transformer in each of said groups, electroradiative responsive means which changes its impedance in response to electromagnetic energy connected from the first terminal of said first voltage divider network to the control electrode of said controlled rectifier means in each of said groups, means for radiating electromagnetic energy at predetermined intervals, the electroradiative responsive means in each of said groups reducing its impedance when said means for radiating electromagnetic energy emits electromagnetic energy, said second capacitance means discharging through said electroradiative responsive means to apply a control signal to the control electrode of said controlled rectifier means when said electroradiative responsive means reduces its impedance, the control signal applied to the control electrode of said controlled rectifier means causing the controlled rectifier means in each of the groups to switch to its conductive state, which allows said fourth capacitance means to discharge through the primary windings of said pulse transformers, to produce pulses in the secondary windings of the pulse transformers and switch all of the controllable semiconductor devices in all of the groups simultaneously.

9. An electrical converter comprising a plurality of controllable semiconductor devices each having main electrodes and a control electrode, the main electrodes of said controllable semiconductor devices being serially connected, means connected in circuit relation with each of said controllable semiconductor devices for controlling the rate of change of current in each device, and for distributing transient and steady state voltages across said devices in a substantially uniform manner, said serially connected controllable semiconductor devices being arranged in serially connected groups each having first and second ends, each of said groups having a predetermined number of serially connected controllable semiconductor devices, each of said groups including a pulse transformer having a primary winding and a plurality of secondary windings, each of said secondary winding being connected in circuit relation with a control electrode of one of said controllable semiconductor devices, each of said groups having voltage divider means connected between the first and second ends of said groups, said voltage divider means including a plurality of capacitors and terminals, the primary windings of said pulse transformers being connected between a terminal of said voltage divider means and one of the ends of its associated groups, controlled rectifier means having main electrodes and a control electrode, the main electrodes of said controlled rectifier means being connected in series circuit relation with the primary winding of said pulse transformer in each of said groups, electroradiative responsive means which changes its impedance in response to electromagnetic energy connected from another of the terminals of said voltage divider means to the control electrode of said controlled rectifier means in each of said groups, means for radiating electromagnetic energy at predetermined intervals, the electroradiative responsive means in each of said groups reducing its impedance when said means for radiating electromagnetic energy emits electromagnetic energy, one of said capacitor means in said voltage distributing means discharging through said electroradiative responsive means to apply a control signal to the control electrode of said controlled rectifier means when said electroradiative responsive means reduces its impedance, the control signal applied to the control electrode of said controlled rectifier means causing the controlled rectifier means in each of the groups to switch to its conductive state, which allows another of the capacitors of said voltage divider means to discharge through the primary winding of said pulse transformer, to produce pulses in the secondary windings of the pulse transformers and switch all of the controllable semiconductor devices in all of the groups simultaneously, without affecting the voltage distribution between groups.

10. An electrical converter comprising a plurality of controllable semiconductor devices each having main electrodes and a control electrode, the main electrodes of said controllable semiconductor devices being serially connected, said serially connected controllable semiconductor devices being arranged into a plurality of serially connected groups each having first and second ends, each of said groups having a predetermined number of serially connected controllable semiconductor devices, each of said groups including a pulse transformer having a primary winding and a plurality of secondary windings, each of said secondary windings being connected in circuit relation with the control electrode of one of said controllable semiconductor devices, each of said groups having first and second voltage divider networks connected to the first and second ends of its associated group, said first voltage divider network including first and second serially connected capacitance means separated by a first terminal, with the first capacitance means being connected to the first end of the group and the second capacitance means being connected to the second end of the group, said second voltage divider network including third and fourth capacitance means and a bridge rectifier having input terminals and output terminals, said third capacitance means being connected to the first end of the group and one of the input terminals of said bridge rectifier, the other input terminal of said bridge rectifier being connected to the second end of the group, said fourth capacitance means being connected across the output terminals of said bridge rectifier, the primary winding of said pulse transformer being connected across the output terminals of said bridge rectifier, controlled rectifier means having a main electrode and a control electrode, the main electrodes of said controlled rectifier means being connected in series circuit relation with the primary winding of the pulse transformer in each of said groups, electroradiative responsive means connected between the first terminal of said first voltage divider network and the control electrode of said controlled rectifier means in each of said groups, means for radiating electromagnetic energy at predetermined intervals, said electroradiative responsive means reducing its impedance in response to the electromagnetic energy, to allow said second capacitance means to discharge therethrough and apply a control signal to the control electrode of said controlled rectifier means, the control signal switching said controlled rectifier means to its conductive state and allowing said fourth capacitance means to discharge through the primary winding of each of said pulse transformers and switch all of the controlled semiconductor devices in all of the groups simultaneously.

11. An electrical converter comprising a plurality of controllable semiconductor devices each having main electrodes and a control electrode, the main electrodes of said controllable semiconductor devices being serially connected, means connected in circuit relation with each of said controllable semiconductor devices for controlling the rate of change of current in each device and for distributing transient and steady state voltages across said devices in a substantially uniform manner, said serially connected controllable semiconductor devices being arranged in serially connected groups each having first and second ends, each of said groups having a predetermined number of serially connected controllable semiconductor devices, each of said groups including a pulse transformer having a primary winding and a plurality of secondary windings, each of said secondary windings being connected in circuit relation with a control electrode of one of said controllable semiconductor devices, each of said groups having voltage divider means connected to the first and second ends of its associated group, said voltage divider means including a plurality of capacitors and terminals, bridge rectifier means connected in circuit relation with said voltage divider means, said bridge rectifier means having input terminals and output terminals, the primary winding of said pulse transformer being connected across the output terminals of said bridge rectifier means, controlled rectifier means having main electrodes and a control electrode, the main electrode of said controlled rectifier means being connected in series circuit relation with the primary winding of each of said groups, electroradiative responsive means connected between a terminal of the voltage divider means and the control electrode of said controlled rectifier means in each of said groups, means for radiating electromagnetic energy at predetermined intervals, said electroradiative responsive means reducing its impedance in response to electromagnetic energy, to allow one of said capacitors of said voltage divider means to discharge therethrough and apply a control signal to the control electrode of said controlled rectifier means, the control signal switching said controlled rectifier means to its conductive state and allowing another of said capacitors of said voltage divider means to discharge through the primary winding of said pulse transformer and pulse all of the controllable semiconductor devices in all of the groups simultaneously, and maintain a substantially uniform voltage distribution between the groups.

12. An electrical converter comprising a plurality of controllable semiconductor devices each having main electrodes and a control electrode, the main electrodes of said controllable semiconductor devices being serially connected, said serially connected controllable semiconductor devices being arranged into serially connected groups each having first and second ends, each of said groups having a predetermined number of serially connected controllable semiconductor devices, each of said groups including a pulse transformer having a primary winding and a plurality of secondary windings, each of said secondary windings being connected in circuit relation with the control electrode of one of said controllable semiconductor devices, each of said groups having a voltage divider connected across its first and second ends, said voltage divider including first and second capacitors and a bridge rectifier having input terminals and output terminals, said first capacitor being connected to the first end of its associated group and to one of the input terminals of said bridge rectifier, the other input terminal of said bridge rectifier being connected to the second end of its associated group, said second capacitor being connected across the output terminals of said bridge rectifier, the primary winding of said pulse transformer being connected across the output terminals of said bridge rectifier, a semi-conductor gate controlled switch having main electrodes and a control electrode, the main electrodes of said gate controlled switch being connected in series circuit relation with said primary winding, electroradiative responsive means which changes its impedance in response to electromagnetic energy, third capacitance means, said electroradiative responsive means and said third capacitance means being connected serially from one of the output terminals of said bridge rectifier to the control electrode of said gate controlled switch, means for radiating a pulse of electromagnetic energy having a predetermined duration, said electroradiative responsive means in each of said groups changing its impedance at the start of the electromagnetic pulse, which enables said third capacitance means to charge and switch said gate controlled switch to its conductive state, said second capacitance means discharging through the primary winding of said pulse transformer when said gate controlled switch becomes conductive, to simultaneously apply a signal to said serially connected controllable semiconductor devices, said third capacitance means discharging at the termination of the electromagnetic pulse, which switches the gate controlled switch to its blocking state.

13. An electrical converter comprising a plurality of controllable semiconductor devices each having main electrodes and a control electrode, the main electrodes of said controllable semiconductor devices being serially connected, inductance means connected in series circuit relation with each of said controllable semiconductor devices for controlling the rate of change of current in each of said devices, capacitance and resistance means each connected in shunt with each of the series circuits including said controllable semiconductor devices and said inductance means for distributing transient and steady state voltages across said devices in a substantially uniform manner, resistance means connected in shunt with said inductance means for damping current oscillations, said serially connected controllable semiconductor devices being arranged into groups having first and second ends, with each group having a predetermined number of serially connected controllable semiconductor devices, each of said groups including a pulse transformer having a primary winding and a plurality of secondary windings, each of said secondary windings being connected in circuit relation with a control electrode of one of said controllable semiconductor devices, each of said groups having a voltage divider connected across its first and second ends, said voltage divider including first and second capacitors and a bridge rectifier having input terminals and output terminals, said first capacitor being connected to the first end of its associated group and to one of the input terminals of said bridge rectifier, another input terminal of said bridge rectifier being connected to the second end of its associated group, said second capacitor being connected across the output terminals of said bridge rectifier, the primary winding of said pulse transformed being connected across the output terminals of said bridge rectifier, a semiconductor gate controlled switch having main electrodes and a control electrode, the main electrodes of said gate controlled switch being connected in series circuit relation with said primary winding, electroradiative responsive means which changes its impedance in response to electromagnetic energy, a third capacitor, said electroradiative responsive means and said third capacitor being connected serially from one of the output terminals of said bridge rectifier to the control electrode of said gate controlled switch, means for radiating a pulse of electromagnetic energy having a predetermined duration, said electroradiative responsive means in each of said groups changing its impedance at the start of the electromagnetic pulse which enables said third capacitor to apply a signal to the control electrode of the gate controlled switch and switch it to its conductive state, said second capacitor discharging through the primary winding of said pulse transformer when said gate controlled switch is rendered conductive, to simultaneously apply a signal to all of the serially connected controllable semiconductor devices, said third capacitor discharging at the termination of the electromagnetic pulse, which applies a signal to the gate electrode of said gate controlled switch to switch said gate controlled switch to its blocking state.

14. An electrical converter comprising a plurality of controllable semiconductor devices each having main electrodes and a control electrode, the main electrodes of said controllable semiconductor devices being serially connected, said serially connected controllable semiconductor devices being arranged into groups each having first and second ends, each of said groups having a predetermined number of serially connected controllable semiconductor devices, each of said groups including a pulse transformer having a primary winding and a plurality of secondary windings, each of said secondary windings being connected in circuit relation with a control electrode of one of said controllable semiconductor devices, voltage divider means connected across the first and second ends of said groups, said voltage divider means including a plurality of capacitors and terminals, the primary winding of the pulse transformers of each of said groups being connected to one of the terminals of said voltage divider means and to one of the ends of its associated group, first controlled rectifier means having main electrodes and a control electrode, the main electrodes of said first controlled rectifier means being connected in series circuit relation with said primary winding in each of said groups, second controlled rectifier means having main electrodes and a control electrode, the main electrodes of said second controlled rectifier means being connected from another of the terminals of said voltage divider means to the control electrode of said first controlled rectifier means in each of said groups, electroradiative responsive means which produces an electric potential in response to electromagnetic radiation, said electroradiative responsive means being connected in circuit relation with the control electrode of said second controlled rectifier means in each of said groups, means for radiating electromagnetic energy at predetermined intervals, said electroradiative responsive means in each of said groups switching said second controlled rectifier means to a conductive state in response to the electromagnetic radiation, which allows one of the capacitors of said voltage divider means to discharge and apply a signal to the control electrode of said first controlled rectifier means, said first controlled rectifier means being switched to its conductive state which allows another of the capacitors of said voltage divider means to discharge through the primary winding of the pulse transformer in each of said groups, to simultaneously apply a signal to the control electrodes of said purality of serially connected controllable semiconductor devices.

15. An electrical converter comprising a plurality of controllable semiconductor devices each having main electrodes and a control electrode, the main electrodes of said controllable semiconductor devices being serially connected, means connected in circuit relation with each of said controllable semiconductor devices for controlling the rate of change of current in each device and for distributing transient and steady state voltages across said devices in a substantially uniform manner, said serially connected controllable semiconductor devices being arranged in serially connected groups each having first and second ends, each of said groups having a predetermined number of serially connected controllable semiconductor devices, each of said groups including a pulse transformer having a primary winding and a plurality of secondary windings, each of said secondary windings being connected in circuit relation with the control electrode of one of said controllable semiconductor devices, voltage divider means connected across the first and second ends of each of said groups, said voltage divider means including a plurality of capacitors and terminals, the primary winding of the pulse transformer in each of said groups being connected to one of the terminals of said voltage divider means and to one of the ends of its associated group, first semiconductor switching means having main electrodes and a control electrode, the main electrodes of said first semiconductor switching means being connected in series circuit relation with said primary winding in each of said groups, second semiconductor switching means having main electrodes and a control electrode, the main electrode of said second semi-conductor switching means being connected from another of the terminals of said voltage divider means to the control electrode of said first semiconductor switching means in each of said groups, electroradiative responsive means which changes its impedance in response to electromagnetic radiation said electroradiative responsive means being connected in circuit relation with the control electrode of said second semiconductor switching means in each of said groups, means for radiating electromagnetic energy at predetermined intervals, said electroradiative responsive means in each of said groups switching said second semiconductor switching means to its conductive state in response to the electromagnetic radiation, which allows one of the capacitors from said voltage divider means to discharge and apply a control signal to the control electrode of said first semiconductor switching means, said first semiconductor switching means being switched to its conductive state by said control signal which allows another of the capacitors in said voltage divider means to discharge through the primary winding of the pulse transformer in each of said groups to simultaneously apply a signal to the control electrodes of said plurality of serially connected controllable semiconductor devices.

References Cited

UNITED STATES PATENTS

| | | | |
|---|---|---|---|
| 3,158,799 | 11/1964 | Kelley et al. | 321—27 |
| 3,181,003 | 4/1965 | Sauber | 307—88.5 |
| 3,209,154 | 9/1965 | Maring | 250—214 |
| 3,229,158 | 1/1966 | Jensen | 315—158 |
| 3,302,094 | 1/1967 | Boksjo et al. | 321—27 |
| 3,321,695 | 5/1967 | Augier | 321—25 |
| 3,304,431 | 2/1967 | Biard et al. | 250—211 |

JOHN F. COUCH, *Primary Examiner.*

G. GOLDBERG, *Assistant Examiner.*